US006825135B2

(12) United States Patent
Li et al.

(10) Patent No.: US 6,825,135 B2
(45) Date of Patent: Nov. 30, 2004

(54) ELIMINATION OF DENDRITE FORMATION DURING METAL/CHALCOGENIDE GLASS DEPOSITION

(75) Inventors: Jiutao Li, Boise, ID (US); Allen McTeer, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/164,646

(22) Filed: Jun. 6, 2002

(65) Prior Publication Data

US 2003/0228771 A1 Dec. 11, 2003

(51) Int. Cl.[7] ................................................. H01L 21/26
(52) U.S. Cl. ..................... 438/795; 438/674; 438/796
(58) Field of Search .......................... 438/95, 113, 130, 438/466–469, 795–6, 674

(56) References Cited

U.S. PATENT DOCUMENTS

| 3,271,591 | A |   | 9/1966  | Ovshinsky            |       |
|-----------|---|---|---------|----------------------|-------|
| 3,622,319 | A |   | 11/1971 | Sharp                |       |
| 3,743,847 | A |   | 7/1973  | Boland               |       |
| 3,961,314 | A |   | 6/1976  | Klose et al.         |       |
| 3,966,317 | A |   | 6/1976  | Wacks et al.         |       |
| 3,983,542 | A |   | 9/1976  | Ovshinsky            |       |
| 3,988,720 | A |   | 10/1976 | Ovshinsky            |       |
| 4,115,872 | A | * | 9/1978  | Bluhm .............   | 257/2 |
| 4,177,474 | A |   | 12/1979 | Ovshinsky            |       |
| 4,267,261 | A |   | 5/1981  | Hallman et al.       |       |
| 4,269,935 | A |   | 5/1981  | Masters et al.       |       |
| 4,312,938 | A |   | 1/1982  | Drexler et al.       |       |
| 4,316,946 | A |   | 2/1982  | Masters et al.       |       |
| 4,320,191 | A |   | 3/1982  | Yoshikawa et al.     |       |
| 4,405,710 | A |   | 9/1983  | Balasubramanyam et al. |     |
| 4,419,421 | A |   | 12/1983 | Wichelhaus et al.    |       |
| 4,499,557 | A |   | 2/1985  | Holmberg et al.      |       |
| 4,597,162 | A |   | 7/1986  | Johnson et al.       |       |
| 4,608,296 | A |   | 8/1986  | Keem et al.          |       |
| 4,637,895 | A |   | 1/1987  | Ovshinsky et al.     |       |
| 4,646,266 | A |   | 2/1987  | Ovshinsky et al.     |       |
| 4,664,939 | A |   | 5/1987  | Ovshinsky            |       |

(List continued on next page.)

FOREIGN PATENT DOCUMENTS

| JP | 56126916     | 10/1981 |
|----|--------------|---------|
| WO | WO 97/48032  | 12/1997 |
| WO | WO 99/28914  | 6/1999  |
| WO | WO 00/48196  | 8/2000  |
| WO | WO 02/21542 A1 | 3/2002 |

OTHER PUBLICATIONS

P. Boolchand, et al., "Mobile Silver Ions and Glass Formation in Solid Electrolytes" *Nature*, vol. 410, Apr. 2001, pp. 1070–1073.

Y. Hirose, et al., "High Speed Memory Behavior and Reliability of an Amorphous As2S3 Film Doped With Ag" *Physica Status Solidi* vol. (a), No. 16, (1980) K187–K190.

Y. Hirose, et al., "Polarity–Dependent Memory Switching and Behavior of Ag Dendrite in Ag–Photodoped Amorphous As2–s3 Films" *J. Appl. Phys.* vol. 47, No. 6, Jun. 1976 pp 2767–2772.

(List continued on next page.)

*Primary Examiner*—D Le
(74) *Attorney, Agent, or Firm*—Dickstein Shapiro Morin & Oshinsky LLP

(57) ABSTRACT

A method of forming a programmable conductor memory cell array is disclosed wherein metal and chalcogenide glass are co-sputtered to fill an array of cell vias in a prepared substrate. The prepared substrate is heated above room temperature before the metal and chalcogenide glass film is deposited, and the heating is maintained throughout the deposition. The resulting metal/chalcogenide glass film has good homogeneity, a desired ratio of components, and has a regular surface.

13 Claims, 3 Drawing Sheets

U.S. PATENT DOCUMENTS

| | | |
|---|---|---|
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,350,484 A | 9/1994 | Gardner et al. |
| 5,360,981 A | 11/1994 | Owen et al. |
| 5,500,532 A | 3/1996 | Kozicki |
| 5,512,328 A | 4/1996 | Yoshimura et al. |
| 5,512,773 A | 4/1996 | Wolf et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,920,788 A | 7/1999 | Reinberg |
| 5,998,066 A | 12/1999 | Block et al. |
| 6,031,287 A | 2/2000 | Harshfield |
| 6,072,716 A | 6/2000 | Jacobson et al. |
| 6,077,729 A | 6/2000 | Harshfield |
| 6,117,720 A | 9/2000 | Harshfield |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,440,837 B1 | 8/2002 | Harshfield |
| 6,469,364 B1 | 10/2002 | Kozicki |
| 6,473,332 B1 | 10/2002 | Ignatiev et al. |
| 6,487,106 B1 | 11/2002 | Kozicki |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 * | 9/2002 | Moore et al. ............... 438/795 |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki et al. |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

A. V. Kolobov, et al., "Photodoping of Amorphous Chalcogenides by Metals" *Advances in Phyics* 1991, vol. 40, No. 5, pp. 625–684.

M. Mitkova, et al., "Dual Chemical Role of Ag as an Additive in Chalcogenide Glasses" *Physical Review Letters* vol. 83, No. 19, pp. 3748–3851.

K. L. Tai, et al., "Bilevel High Resolution Photolithographic Technique For Use With Wafers Stepped and/or Reflecting Surfaces" *J. Vac. Sci. Technol.* vol. 16, No. 6, Nov./Dec. 1979 pp. 1977–1979.

K. L. Tai, et al., "Inorganic Resist Systems for VLSI Microlithography" pp. 9–35.

K. L. Tai, et al., "Submicron Optical Lithography Using an Inorganic Resist/Polymer Bilevel Scheme" *J. Vac. Sci. Technol.* vol. 17, No. 5, Sep./Oct. 1980 pp. 1169–1176.

A. Yoshikawa, et al., "Angstroms Resolution in Se–Ge Inorganic Photoresists" *Japanese Journal of Applied Physics* vol. 20, No. 2, Feb. 1981, pp. L81–L83.

A. Yoshikawa, et al., "Dry Development of Se–Ge Inorganic Photoresist" *Appl. Phys. Lett.* vol. 36, No. 1, Jan. 1980, pp. 107–109.

A. Yoshikawa, et al., "A New Inorganic Electron Resist of High Contrast" *Appl. Phys. Lett.* Vol 31, No. 3, Aug. 1977, pp. 161–163.

A. Yoshikawa, et al., "A Novel Inorganic Photoresist Utilizing Ag Photodoping in Se–Ge Glass Films" *Appl. Phys. Lett.* vol. 29, No. 10, Nov. 15, 1976, pp. 677–679.

U.S. patent application Ser. No. 10/164,429, Li et al., filed Jun. 6, 2002.

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Axon Technologies Corporation, Technology Description: *Programmable Metalization Cell(PMC)*, pp. 1–6 (Pre–May 2000).

Baranovskii, S.D.; Cordes, H., On the conduction mechanism in ionic glasses, J. Chem Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches. Thin solid films 97 (1982) 165–171.

Bernede, J.C.; Khelil, A.; Kettaf, M.; Conan, A., Transition from S–to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data Vol. 53–54 (1987) 415–420.

Boolchand P.; Grothaus, J.; Bresser, W.J.; Suranyi, P., Structural origin of broken chemical order in GeSe2 glass, Phys. Rev. B 25 (1982) 2975–2978.

Boolchand, P.; Grothaus, J.; Phillips, J.C., Broken chemical order and phase seperation in GexSe1–x glasses, Solid state comm. 45 (1983) 183–185.

Boolchand, P., Bresser, W.J., Compositional trends in glass transition temperature (Tg), network connectivity and nanoscale chemical phase in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17th (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernayk, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D.: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title p.–114 (UMI Company, May 1999).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy $Ge_xSe_{1-x}$ around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J. Capacitance anomaly near the metal–non-metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Huggett et al., Development of silver sensitized germanium selenide photoresist by reactive sputter etching in $SF_6$, 42 Appl. Phys. Lett., No. 7, pp. 592–594 (Apr. 1983).

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo-enhanced diffusion of Ag in amorphous films of $Ge_2S_3$, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous $As_2Se_7$ before switching, Phys. Stat. Sol. (a) 13 (1972) K105–K109.

Joullie, A.M.; Marucchi, J., Electrical properties of the amorphous alloy $As_2Se_5$, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi et al., *Mechanism of photosurface deposition*, 164–166 J. Non–Cryst. Solids, pp. 1231–1234 (1993).

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of $Ag_x(GeSe_3)_{1-x}$ (0<=x<=0.571) glasses, Solid state Ionics 123 (1999) 259–269.

Kluge, G.; Thomas, A.; Klabes, R.; Grotzschel, R., Silver photodiffusion in amorphous $Ge_xSe_{100-x}$, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Arndreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M. Memory switching in amorphous GeSeTl chalcogenide semiconductor films, Thin Solid Films 240 (1994) 143–146.

Kozicki et al., Silver incorporation in thin films of selenium rich Ge–Se glasses, International Congress on Glass, vol. 2, Extended Abstracts, Jul. 2001, pp. 8–9.

Kozicki et al., Applications of Programmable Resistance Changes In Metal–Doped Chalcogenides, Electrochemical Society Proceedings, vol. 99–13, 1999, pp. 298–309.

Kozicki et al., Nanoscale effects in devices based on chalcogenide solid solutions, Superlattices and Microstructures, vol. 27, No. 516, 2000, pp. 485–488.

Kozicki et al., Nanoscale phase separation in Ag–Ge–Se glasses, Microelectronic Engineering 63 (2002) pp. 155–159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in $Ge_xSe_{1-x}$ glass, Appl. Phys. Lett. 46 (1985) 543–545.

Matsushita, T.; Yamagami, T.; Okuda, M., Polarized memory effect observed on Se–$SnO_2$ system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in $TeO_2$–$V_2O_5$ based glasses, Journal de Physique IV 2 (1992) C2–185 –C2–188.

McHardy et al., The dissolution of metals in amorphous chalcogenides and the effects o electron and ultraviolet radiation, 20 J. Phys. C.: Solid State Phys., pp. 4055–4075 (1987)f.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B. 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Owen et al., Metal–Chalcogenide Photoresists for High Resolution Lithography and Sub–Micron Structures, Nanostructure Physics and Fabrication, pp. 447–451 (M. Reed et. 1989).

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.;Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Shimizu et al., *The Photo–Erasable Memory Switching Effect of Ag Photo–Doped Chalcogenide Glasses*, 46 B. Chem Soc. Japan, No. 12, pp. 3662–3365 (1973).

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability of GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behavior of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorpous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Boolchand, P., The maximum in glass transition temperature (Tg) near x=1/3 in GexSe1–x Glasses, Asian Journal of Physics (2000) 9, pp. 709–72.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc. Apr. 6, 2000.

* cited by examiner

ELIMINATION OF DENDRITE FORMATION DURING METAL/CHALCOGENIDE GLASS DEPOSITION

REFERENCE TO RELATED APPLICATION

This application is related to the disclosure of U.S. application Ser. No. 10/164,429 of Li et al, filed Jun. 6, 2002, entitled CO-SPUTTER DEPOSITION OF METAL-DOPED CHALCOGENIDES.

BACKGROUND OF THE INVENTION

1. Field of the Invention

This invention relates generally to methods of forming metal-chalcogenide glass structures and more particularly to a method of preventing formation of extraneous metal dendrite structures during fabrication of programmable conductor memory cells using metal-chalcogenide glass systems.

2. Description of the Related Art

The digital memory most commonly used in computers and computer system components is the dynamic random access memory (DRAM), wherein voltage stored in capacitors represents digital bits of information. Electric power must be supplied to the capacitors to maintain the information because, without frequent refresh cycles, the stored charge dissipates, and the information is lost. Memories that require constant power are known as volatile memories.

Non-volatile memories do not need frequent refresh cycles to preserve their stored information, so they consume less power than volatile memories. The information stays in the memory even when the power is turned off. There are many applications where non-volatile memories are preferred or required, such as in lap-top and palm-top computers, cell phones or control systems of automobiles. Non-volatile memories include magnetic random access memories (MRAMs), erasable programmable read only memories (EPROMs) and variations thereof.

Another type of non-volatile memory is the programmable conductor or programmable metallization memory cell, which is described by Kozicki et al. in U.S. Pat. No. 6,084,796 and is included by reference herein. The programmable conductor cell of Kozicki et al. (also referred to as a metal dendrite memory) comprises a glass ion conductor, such as a chalcogenide-metal ion glass, and a plurality of electrodes disposed at the surface of the fast ion conductor and spaced a distance apart from one another. The glass/ion element shall be referred to herein as a "glass electrolyte," or, more generally, a "cell body." When a voltage is applied across the anode and the cathode, a non-volatile metal dendrite grows from the cathode along the surface of the cell body towards the anode. The growth of the dendrite depends upon applied voltage and time; the higher the voltage, the faster the growth rate; and the more time, the longer the dendrite. The dendrite stops growing when the voltage is removed. The dendrite shrinks, re-dissolving metal ions into the cell body, when the voltage polarity is reversed.

The programmable conductor memory cell can serve as a "one" state when the conductive path has grown all the way from the cathode to the anode, thus providing a low resistance metallic conduction path. The programmable conductor memory cell is in a "zero" state when the conductive path is at least partially dissolved, and the metallic conduction path is broken and the resistance of the cell is several orders of magnitude higher. In other arrangements, varying extent of the conductive path can be used in forming variable capacitors or variable resistors.

The recent trends in memory arrays generally have been to first form a via, then fill it with a conventional memory storage element (e.g., a capacitor) and etch back. It is simple to isolate individual memory cells with this container structure. Following this trend, programmable memory cells have been also fabricated using this sort of container configuration, wherein the electrodes and body layers are deposited into a via etched into an insulating layer. Under normal operating conditions, conductive paths can grow between the electrodes, such as along the interface between the cell and the via wall. Typically, the memory cell is formed in an array having a conventional memory array circuit design. For example, in a conventional cross-point circuit design, memory elements are formed between upper and lower conductive lines at intersections. Typically, after forming the lower set of lines, a via is formed in an insulating layer and filled with the memory element, such as a glass electrolyte or glass fast ion diffusion (GFID) element.

Deposition of metal and chalcogenide glass is not simple. At normal deposition temperatures, metal atoms are highly mobile and can diffuse away from the glass or can form extraneous metal-rich structures, thus altering the component proportions in the deposited mixture and, thus, the performance of the programmable conductor memory cells.

Accordingly, a need exists for improved methods for depositing metal and chalcogenide glass to form integrated programmable conductor memory arrays.

SUMMARY OF THE INVENTION

In accordance with one aspect of the present invention, a method is provided for forming a programmable conductor memory cell. The method includes sputtering metal and chalcogenide glass onto a prepared substrate. The substrate is maintained at a temperature higher than room temperature during sputtering.

In accordance with another aspect of the present invention, a method is provided for depositing a metal/chalcogenide glass film with a desired metal to glass ratio onto a substrate. The method includes pre-heating the substrate to a desired temperature between about 40° C. and 130° C. Metal and chalcogenide glass are co-sputtering metal and chalcogenide glass onto the substrate after pre-heating. The substrate is held at the desired temperature during the co-sputtering.

In accordance with another aspect of the invention, a method is provided for co-sputtering a homogeneous metal/chalcogenide glass layer onto a irregular surface. The irregular surface is kept at an elevated temperature, above room temperature, before and during the co-sputtering.

DETAILED DESCRIPTION OF THE PREFERRED EMBODIMENT

Figure 1:
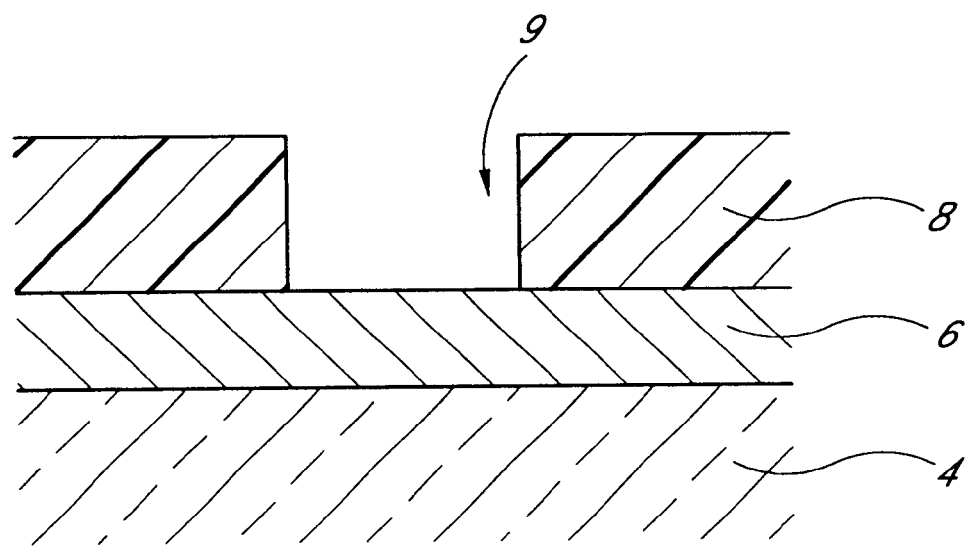
FIG. 1 is a schematic cross-section of a via formed in an insulating layer, within which via chalcogenide glass elements are to be deposited.

Metal/chalcogenide glass films form the key functional structure of programmable conductor memory cells. It is within these films that metal dendrite growth or shrinkage occurs in response to an applied voltage. Reproducible conductive path growth and shrinkage are essential to the proper functioning of these memory devices. The programmable conductor memory cell can serve as a "one" state when the conductive has grown all the way from the cathode to the anode, thus providing a metallic path for easy conduction. The programmable conductor memory cell can serve as a "zero" state when the conductive path is at least partially dissolved, and the short from electrode to electrode is broken.

Often, the metal and chalcogenide glass are sputtered to fill an array of device vias, as one or more step(s) in fabricating a programmable conductor memory cell array. However, because of the high mobility of the metal atoms, metal dendrites can form around the device vias during the sputter deposition. The dendrites seem to nucleate at top edges of the vias and can extend for several microns along the surrounding surface. These dendrites are extraneous and should not be confused with the conductive paths that grow and shrink within the programmable conductor memory cells under normal operating conditions.

Extraneous dendrite formation during metal/ chalcogenide glass deposition can cause a number of problems. The metal contained within the extraneous dendrites is intended to be included in the as deposited metal/ chalcogenide glass mixture that forms the programmable conductor memory cells. The metal that forms the dendrites is removed from the metal/chalcogenide glass mixture by the migration of metal during extraneous dendrite formation and the component proportions are thus different than intended. Controlled and consistent composition is important for reproducible functioning of the device. If there is less metal in the cell mixture, it may take a higher voltage and/or a longer time for a cell dendrite to grow across the cell and to switch the cell from a "zero" state to a "one" state. The extraneous dendrites also cause changes in the surface morphology around the device vias. This non-planar topography can cause problems during subsequent process steps, such as photolithography and etch.

A method of depositing metal/chalcogenide glass films to form programmable conductor memory cells without forming extraneous dendrites is needed. The aforementioned need is satisfied by the process of the preferred embodiment, which includes conducting the deposition process under conditions of elevated temperatures.

The preferred embodiments are illustrated in the context of co-sputtering of metal and chalcogenide glass for a programmable conductor memory cell array, for which the preferred embodiments have particular utility. The skilled artisan will readily appreciate, however, that the materials and methods disclosed herein will have application in a number of other contexts where prevention of dendrite formation is desirable. For example, in one embodiment, chalcogenide glass (e.g., $Ge_xSe_{1-x}$) is first deposited, followed by sputtering metal (e.g., Ag). The glass element can then be doped with metal by photodissolution, as is known from prior disclosures. In such an embodiment, elevated temperatures are preferably maintained, as disclosed below, at least during the metal sputtering phase.

These and other objects and advantages of the present invention will become more fully apparent from the following description taken in conjunction with the accompanying drawings.

There are a number of possibilities that might explain extraneous on surface dendrite formation during deposition. One possible mechanism is that the step edge, where the via meets the uppermost surface of the surrounding insulating layer, is energetically favorable for atom absorption. Therefore, highly mobile metal atoms have a high probability of being absorbed at the step edge. Metal atoms cluster together at the step edge, forming a nucleation site for dendrite growth. There are many free metal atoms available from the surrounding layer surface to contribute to a growing dendrite.

If a metal with low mobility were used, there would be less likelihood of forming extraneous dendrites, but this would work against the proper functioning of a chalcogenide glass-based memory device. A metal with low mobility would also be less likely to form a conductive path within the memory cell when a voltage is applied, which is necessary for the cell to function. Metals with high mobility are therefore most desirable for use in chalcogenide glass-based memory devices.

Experiments were done to try to reduce or eliminate extraneous dendrite formation. Test structures were formed on production grade silicon wafers 4 covered by 600 Å of tungsten 6, followed by a 500 Å layer of silicon nitride 8, to simulate actual device array constructions. Individual isolated vias 9 and arrays of vias were patterned and etched into the nitride layer to a depth of 50 nm. The wafers were heated to various test temperatures and held on the heated wafer stage for at least 5 minutes to obtain a stable and uniform temperature distribution across the wafer. Layers of silver and germanium-selenide were co-sputtered to a thickness of 50 nm. Co-sputtering was performed in accordance with the teachings of U.S. application Ser. No. 10/164,429 of Li et al., filed Jun. 6, 2002, entitled CO-SPUTTER DEPOSITION OF METAL-DOPED CHALCOGENIDES, the disclosure of which is incorporated herein by reference. Results from these experiments are shown in FIGS. 2A, 2B, 3A, and 3B for vias having a width of about 0.5 μm. To make comparisons simple, the figures have been drawn to approximately the same magnification.

Figure 2A:
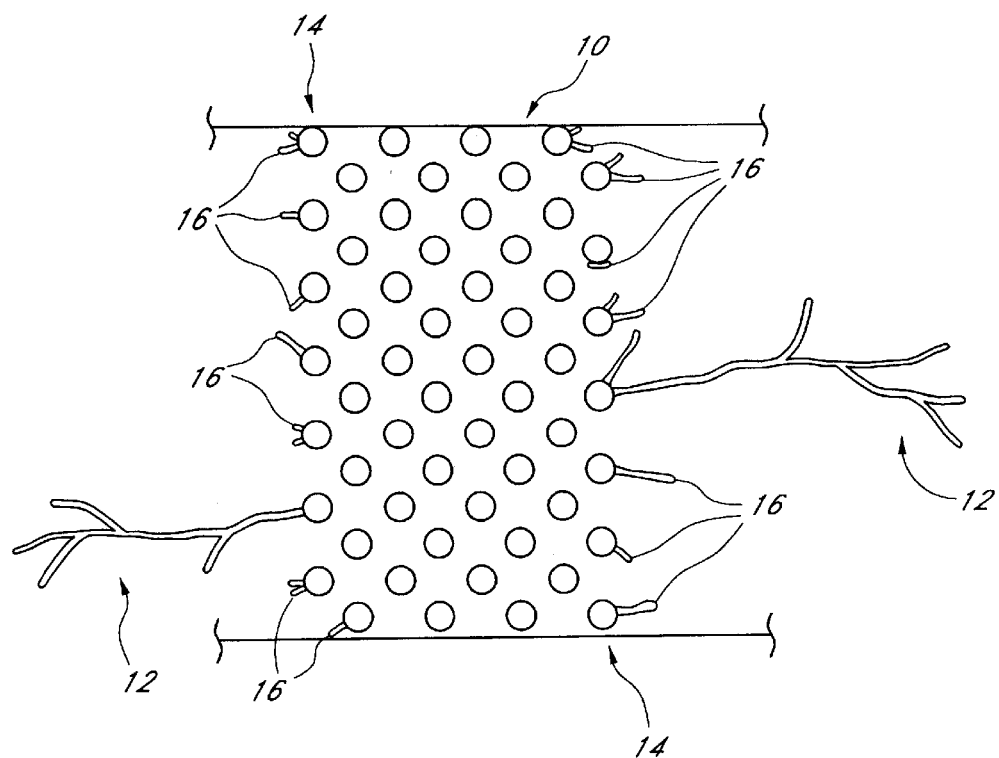
FIG. 2A is a schematic drawing of an array of vias that have been filled with silver and germanium selenide sputtered at room temperature.

FIG. 2A is a schematic drawing made from an electron micrograph that shows a via array structure 10 after deposition of silver and germanium-selenide, co-sputtered at room temperature. There are a number of dendrites 12 growing out from the periphery of the array. In addition, in the outermost columns, nearly every via 14 has the beginning of a silver dendrite structure 16 formed along an edge. These were all seen clearly in the original micrograph whose magnification was 5000×.

Figure 2B:
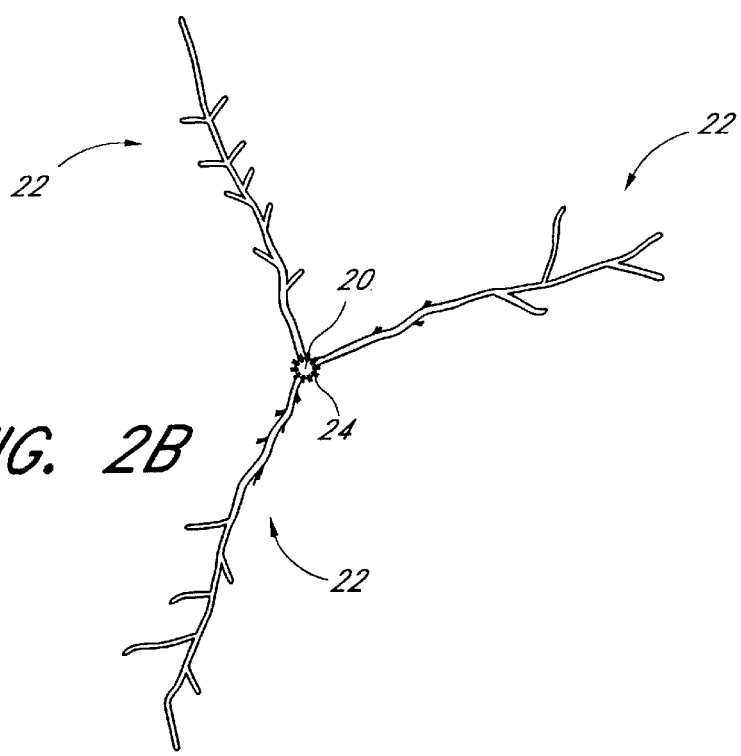
FIG. 2B is a schematic drawing of one isolated via filled with silver and germanium selenide sputtered at room temperature.

FIG. 2B is a schematic drawing made from an electron micrograph that shows an isolated via 20 in another region of the test structure after deposition of silver and germanium-selenide, co-sputtered at room temperature. Extensive silver dendrite growth can be seen in the micrograph whose magnification is 2600×. In one example, three long dendrites 22 extend outward from the test via 20, and additional silver precipitation 24 has occurred along the rim of the via.

Figure 3A:
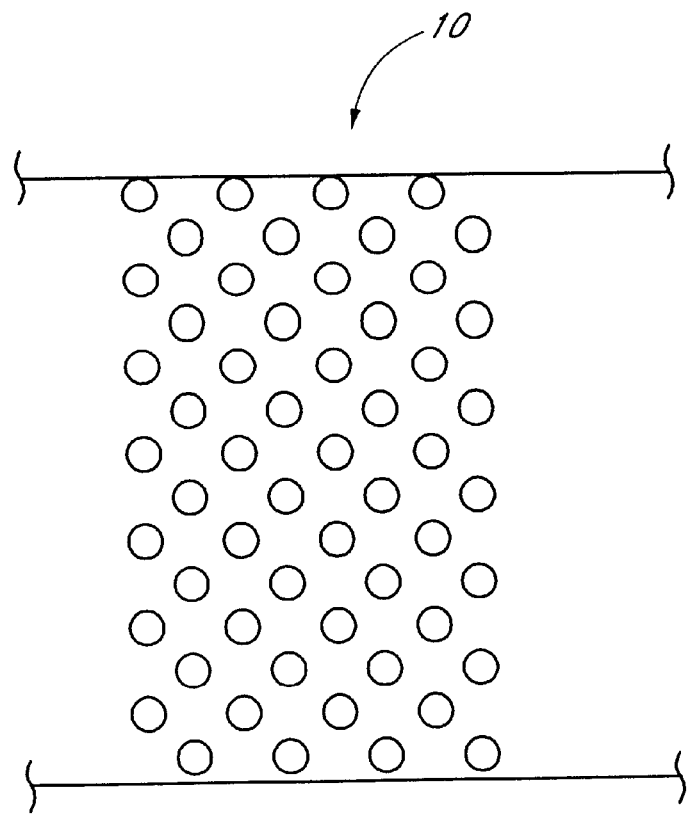
FIG. 3A is a schematic drawing of an array of vias that have been filled with silver and germanium selenide sputtered at 50° C.

FIG. 3A is a schematic drawing made from an electron micrograph that shows a via array structure 10 after deposition of silver and germanium-selenide, co-sputtered at 50° C. No dendrite formation can be seen even at an electron micrograph magnification of 15,000×.

Figure 3B:
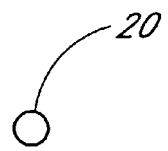
FIG. 3B is a schematic drawing of one isolated via filled with silver and germanium selenide sputtered at 50° C.

FIG. 3B is a schematic drawing made from an electron micrograph that shows an isolated via 20 in another region of the test structure after deposition of silver and germanium-selenide, co-sputtered at 50° C. No dendrite formation or silver precipitation can be seen even at an electron micrograph magnification of 50,000×.

The preferred embodiments of the current invention provide a method of forming a programmable conductor memory cell that minimizes or, preferably, eliminates extraneous dendrite formation.

In a preferred embodiment, a metal and a chalcogenide glass are sputtered onto a prepared substrate that is maintained at a temperature higher than room temperature during the sputtering. Preferably, the metal and the chalcogenide glass are co-sputtered, or sputtered concurrently from separate sputtering targets in the same physical vapor deposition (PVD) or sputtering chamber. The chalcogenide glass can be sputtered using a pulsed DC power supply.

Generally, for fabrication of programmable conductor memory cells having a container configuration, the prepared substrate comprises a top insulating layer with vias therein. It should be understood that, although the illustrated embodiments of the current invention have been described for a container configuration, they may be useful also for other configurations of programmable conductor memory cells and for other applications wherein layers of metal-diffused chalcogenide glass without dendrites are desired.

The chalcogenide glass can comprise chalcogens such as sulfur, selenium, or tellurium. Preferably, the chalcogenide glass also comprises selenium and germanium in a ratio of Ge:Se between about 4:6 and 2:8. The metal can comprise any metal that is a fast diffuser in chalcogenide glass, including but not limited to silver or copper. Preferably, sputtering the metal and chalcogenide glass results in a programmable conductor memory cell with a desired ratio of components.

More generally, it will be understood that the memory cell formed of metal-doped chalcogenide glass comprises constituents in proportions to maintain the cell body in an amorphous state. The skilled practitioner will appreciate that the amorphous state of the metal-doped chalcogenide glass such as germanium selenide ($Ge_xSe_{1-x}$) depends upon both the value of x and the relative concentration of the metal within the memory cell.

A phase diagram can be used to select a value for x and to select the amount of metal that is to dope the chalcogenide glass such that the chalcogenide glass remains amorphous. Such a phase diagram can be found in Mitkova et al., "Dual Chemical Role of Ag as an Additive in Chalcogenide Glasses," *Physical Review Letters*, Vol. 86, No. 19 (Nov. 8, 1999), pp. 3848–3851. FIG. 1 of Mitkova illustrates two glass forming or amorphous regions for germanium selenide ($Ge_xSe_{1-x}$) doped with silver (Ag). In one example, where x is 30, i.e., 0.30, so that the germanium selenide glass is $Ge_{30}Se_{70}$, the amount of silver (Ag) used to dope the germanium selenide should fall within about 0% to 18% or within about 23% to 32% by atomic percentage versus the amount of selenide (Se).

Preferably, the prepared substrate is maintained at a temperature between about 30° C. and 150° C., more preferably between about 40° C. and 130° C. and most preferably, between about 45° C. and 60° C. during the sputtering. In some arrangements, the prepared substrate is maintained at the desired temperature for more than 1 minute and preferably for at least about 5 minutes before sputtering the metal and chalcogenide glass.

Hence, although the foregoing description of the preferred embodiments of the present invention has shown, described and pointed out the fundamental novel features of the invention, it will be understood that various omissions, substitutions and changes in the form of the detail of the method as illustrated as well as the uses thereof may be made by those skilled in the art, without departing from the spirit of the present invention. Consequently, the scope of the present invention should not be limited to the foregoing discussion, but should be defined by the appended claims.

We claim:

1. A method of depositing a metal/chalcogenide glass film with a desired metal to glass ratio onto a substrate, comprising:

pre-heating the substrate to a desired temperature between about 40° C. and 130° C.;

co-sputtering metal and chalcogenide glass onto the substrate after the preheating; and holding the substrate at the desired temperature during the co-sputtering.

2. The method of claim 1, wherein the substrate comprises an array of vias in an insulating layer, the vias configured to receive the metal/chalcogenide glass film as a step in fabricating a programmable conductor memory cell array.

3. The method of claim 1, wherein the metal/chalcogenide glass film comprises silver, germanium, and selenium.

4. The method of claim 1, wherein the desired temperature is between about 45° C. and 60° C.

5. The method of claim 1, wherein the pre-heating lasts for at least 5 minutes.

6. The method of claim 1, wherein the metal/chalcogenide glass film contains between about 25% and 35% metal.

7. The method of claim 1, wherein the metal is a fast diffuser.

8. The method of claim 1, wherein the metal is silver.

9. The method of claim 1, wherein the metal is copper.

10. The method of claim 1, wherein the chalcogenide glass comprises selected from the group consisting of sulfur, germanium, selenium, and tellurium.

11. The method of claim 1, wherein the chalcogenide glass comprises germanium selenide.

12. The method of claim 1, wherein the metal/chalcogenide glass film is formed without extraneous dendrite formation.

13. A method of co-sputtering a homogeneous metal/chalcogenide glass layer onto an irregular surface, comprising keeping the irregular surface at an elevated temperature, above room temperature, before and during the co-sputtering, wherein the elevated temperature is between about 45° C. and 60° C.

* * * * *

UNITED STATES PATENT AND TRADEMARK OFFICE
CERTIFICATE OF CORRECTION

PATENT NO. : 6,825,135 B2
DATED : November 30, 2004
INVENTOR(S) : Jiutao Li et al.

It is certified that error appears in the above-identified patent and that said Letters Patent is hereby corrected as shown below:

Title page,
Item [56], References Cited, U.S. PATENT DOCUMENTS, add:

| | | |
|---|---|---|
| -- 5,335,219 | 8/1994 | Ovshinsky et al. |
| 5,359,205 | 10/1994 | Ovshinsky |
| 5,341,328 | 8/1994 | Ovshinsky et al. |
| 5,406,509 | 4/1995 | Ovshinsky et al. |
| 5,414,271 | 5/1995 | Ovshinsky et al. |
| 5,534,711 | 7/1996 | Ovshinsky et al. |
| 5,534,712 | 7/1996 | Ovshinsky et al. |
| 5,536,947 | 7/1996 | Klersy et al. |
| 5,543,737 | 8/1996 | Ovshinsky |
| 5,591,501 | 1/1997 | Ovshinsky et al. |
| 5,596,522 | 1/1997 | Ovshinsky et al. |
| 5,687,112 | 11/1997 | Ovshinsky |
| 5,694,054 | 12/1997 | Ovshinsky et al. |
| 5,714,768 | 2/1998 | Ovshinsky et al. |
| 5,825,046 | 10/1998 | Czubatyj et al. |
| 5,912,839 | 6/1999 | Ovshinsky et al. |
| 5,933,365 | 8/1999 | Klersy et al |
| 6,011,757 | 1/2000 | Ovshinsky |
| 6,087,674 | 7/2000 | Ovshinsky et al. |
| 6,141,241 | 10/2000 | Ovshinsky et al. |
| 6,339,544 | 1/2002 | Chiang et al. |
| 6,404,665 | 6/2002 | Lowery et al. |
| 6,429,064 | 8/2002 | Wicker |
| 6,437,383 | 8/2002 | Xu |
| 6,462,984 | 10/2002 | Xu et al. |
| 6,480,438 | 11/2002 | Park |
| 6,487,113 | 11/2002 | Park et al. |
| 6,501,111 | 12/2002 | Lowery |
| 6,507,601 | 1/2003 | Hudgens et al. |
| 6,511,862 | 1/2003 | Hudgens et al. |
| 6,511,867 | 1/2003 | Lowery et al. |
| 6,512,241 | 1/2003 | Lai |
| 6,514,805 | 2/2003 | Xu et al. |
| 6,531,373 | 3/2003 | Gill et al. |
| 6,534,781 | 3/2003 | Dennison |
| 6,545,287 | 4/2003 | Chiang |
| 6,545,907 | 4/2003 | Lowery et al. |
| 6,555,860 | 4/2003 | Lowery et al. |
| 6,563,164 | 5/2003 | Lowery et al. |
| 6,566,700 | 5/2003 | Xu |
| 6,567,293 | 5/2003 | Lowery et al. |

UNITED STATES PATENT AND TRADEMARK OFFICE
CERTIFICATE OF CORRECTION

PATENT NO. : 6,825,135 B2
DATED : November 30, 2004
INVENTOR(S) : Jiutao Li et al.

It is certified that error appears in the above-identified patent and that said Letters Patent is hereby corrected as shown below:

Title page (cont'd),

| | | |
|---|---|---|
| 6,569,705 | 5/2003 | Chiang et al. |
| 6,570,784 | 5/2003 | Lowery |
| 6,576,921 | 6/2003 | Lowery |
| 6,586,761 | 7/2003 | Lowery |
| 6,589,714 | 7/2003 | Maimon et al. |
| 6,590,807 | 7/2003 | Lowery |
| 6,593,176 | 7/2003 | Dennison |
| 6,597,009 | 7/2003 | Wicker |
| 6,605,527 | 8/2003 | Dennison et al. |
| 6,613,604 | 9/2003 | Maimon et al. |
| 6,621,095 | 9/2003 | Chiang et al. |
| 6,625,054 | 9/2003 | Lowery et al. |
| 6,642,102 | 11/2003 | Xu |
| 6,646,297 | 11/2003 | Dennison |
| 6,649,928 | 11/2003 | Dennison |
| 6,667,900 | 12/2003 | Lowrey et al. |
| 6,671,710 | 12/2003 | Ovshinsky et al. |
| 6,673,648 | 1/2004 | Lowrey |
| 6,673,700 | 1/2004 | Dennison et al. |
| 6,674,115 | 1/2004 | Hudgens et al. |
| 6,687,427 | 2/2004 | Ramalingam et al. |
| 6,690,026 | 2/2004 | Peterson |
| 6,696,355 | 2/2004 | Dennison |
| 6,687,153 | 2/2004 | Lowery |
| 6,707,712 | 3/2004 | Lowery |
| 6,714,954 | 3/2004 | Ovshinsky et al. |
| 5,896,312 | 4/20/1999 | Kozicki et al. |
| 5,914,893 | 6/22/1999 | Kozicki et al. |
| 6,084,796 | 7/04/2000 | Kozicki et al. --. |

OTHER PUBLICATIONS,
"Owen et al., Metal-Chalcogenide Photoresists for High Resolution Lithography and Sub-Micron Structures, Nano-structure Physics and Fabrication, pp. 447-451 (M. Reed et. 1989)." should read
-- Owen et al., Metal-Chalcogenide Photoresists for High Resolution Lithography and Sub-Miron Structures, Nano-structure Physics and Fabrication, pp. 447-451 (M. Reed, ed. 1989) --.

UNITED STATES PATENT AND TRADEMARK OFFICE
CERTIFICATE OF CORRECTION

PATENT NO. : 6,825,135 B2
DATED : November 30, 2004
INVENTOR(S) : Jiutao Li et al.

It is certified that error appears in the above-identified patent and that said Letters Patent is hereby corrected as shown below:

Column 6,
Line 45, "comprises selected" should read -- comprises components selected --.

Signed and Sealed this

Twentieth Day of December, 2005

JON W. DUDAS
*Director of the United States Patent and Trademark Office*